(12) United States Patent
Huang et al.

(10) Patent No.: US 12,395,106 B2
(45) Date of Patent: Aug. 19, 2025

(54) PERMANENT MAGNET SYNCHRONOUS MOTOR PARAMETER MEASUREMENT METHOD

(71) Applicant: ZHEJIANG UNIVERSITY, Zhejiang (CN)

(72) Inventors: Xiaoyan Huang, Zhejiang (CN); Yelong Yu, Zhejiang (CN); Min Wu, Zhejiang (CN); Zhaokai Li, Zhejiang (CN); Dong Yu, Zhejiang (CN); Tingna Shi, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 100 days.

(21) Appl. No.: 18/036,398

(22) PCT Filed: Dec. 18, 2020

(86) PCT No.: PCT/CN2020/137420
§ 371 (c)(1),
(2) Date: May 10, 2023

(87) PCT Pub. No.: WO2022/099861
PCT Pub. Date: May 19, 2022

(65) Prior Publication Data
US 2024/0007036 A1    Jan. 4, 2024

(30) Foreign Application Priority Data

Nov. 13, 2020   (CN) .......................... 202011268499.6

(51) Int. Cl.
*H02P 23/30*    (2016.01)
*G01R 31/34*    (2020.01)
(Continued)

(52) U.S. Cl.
CPC ............ *H02P 21/18* (2016.02); *G01R 31/343* (2013.01); *H02P 21/22* (2016.02); *H02P 2207/05* (2013.01)

(58) Field of Classification Search
CPC .... H02P 21/141; H02P 21/18; H02P 2207/05; H02P 21/22; H02P 21/14; H02P 21/26;
(Continued)

(56) References Cited

U.S. PATENT DOCUMENTS 6,885,970 B2* 4/2005 Petrovic .................... G01P 3/44
                                                         318/797
10,725,440 B1* 7/2020 Grand ..................... H02P 21/14
(Continued)

FOREIGN PATENT DOCUMENTS

CN      102565540      7/2012
CN      105164912      12/2015
(Continued)

OTHER PUBLICATIONS

Wu, Min; et al., "Online Parameters Identification for PMSM Based on FFRLS and Speed Disturbance Injection," Electric Machines & Control Application, vol. 47, No. 4, Apr. 2020, pp. 44-48.
(Continued)

*Primary Examiner* — Muhammad S Islam
*Assistant Examiner* — Charles S Laughlin
(74) *Attorney, Agent, or Firm* — JCIPRNET

(57) ABSTRACT

A permanent magnet synchronous motor parameter measurement method is provided. The method comprises: performing a maximum torque per ampere and a vector control on a permanent magnet synchronous motor, causing the permanent magnet synchronous motor to run stably and normally; when the permanent magnet synchronous motor is stably and normally running, an α-axis current and a β-axis current are obtained by means of three phase current sam-
(Continued)

pling of the permanent magnet synchronous motor undergoing three phase to two phase transformation, and a rotor position angle and an electrical rotational speed of the permanent magnet synchronous motor are measured and obtained by means of reading a sensor on the permanent magnet synchronous motor; the six physical quantities mentioned-above are taken and a recursive least squares method is used to simultaneously obtain four parametric results for stator resistance, d-axis inductance, q-axis inductance, and flux linkage.

2 Claims, 2 Drawing Sheets

(51) Int. Cl.
*H02P 6/18* (2016.01)
*H02P 21/18* (2016.01)
*H02P 21/22* (2016.01)

(58) Field of Classification Search
CPC ............ H02P 21/13; H02P 6/18; H02P 21/28; H02P 27/06; H02P 6/185; H02P 2203/11; H02P 21/24; H02P 2203/09; H02P 27/08; H02P 6/08; H02P 6/10; H02P 21/06; H02P 25/08; H02P 29/662; H02P 21/0017; H02P 21/0089; H02P 21/20; H02P 21/16; H02P 2205/05; H02P 6/183; H02P 29/60; H02P 6/06; H02P 21/0007; H02P 21/08; H02P 21/34; H02P 23/14; H02P 6/20; H02P 21/00; H02P 21/02; H02P 21/05; H02P 21/32; H02P 2203/03; H02P 25/024; H02P 27/16; H02P 29/00; H02P 6/182; H02P 6/34; H02P 21/12; H02P 21/30; H02P 25/022; H02P 25/026; H02P 27/12; H02P 29/024; H02P 29/0241; H02P 31/00; H02P 6/007; H02P 6/12; H02P 6/28; H02K 1/145; H02K 1/246; H02K 3/28; H02K 2213/03
See application file for complete search history.

(56) References Cited

U.S. PATENT DOCUMENTS

2015/0226776 A1* 8/2015 Nishikubo .............. H02P 21/13
702/65
2015/0381081 A1* 12/2015 Bhangu .................. H02P 23/14
318/400.05

FOREIGN PATENT DOCUMENTS

| CN | 108847800 | 11/2018 |
| CN | 110112975 | 8/2019 |
| CN | 110224648 | 9/2019 |
| CN | 110890855 | 3/2020 |
| JP | 2000341999 | 12/2000 |

OTHER PUBLICATIONS

Yelong Yu; et al., "Full Parameter Estimation for Permanent Magnet Synchronous Motors," IEEE Transactions on Industrial Electronics, vol. 69, No. 5, May 2022, pp. 4376-4386.

"International Search Report (Form PCT/ISA/210) of PCT/CN2020/137420," mailed on Aug. 12, 2021, with English translation thereof, pp. 1-6.

"Written Opinion of the International Searching Authority (Form PCT/ISA/237) of PCT/CN2020/137420," mailed on Aug. 12, 2021, pp. 1-5.

* cited by examiner

PERMANENT MAGNET SYNCHRONOUS MOTOR PARAMETER MEASUREMENT METHOD

CROSS-REFERENCE TO RELATED APPLICATION

This application is a 371 of international application of PCT application serial no. PCT/CN2020/137420, filed on Dec. 18, 2020, which claims the priority benefit of China application no. 202011268499.6, filed on Nov. 13, 2020. The entirety of each of the above-mentioned patent applications is hereby incorporated by reference herein and made a part of this specification.

BACKGROUND

Technical Field

The disclosure relates to a permanent magnet synchronous motor parameter measurement method in the field of permanent magnet synchronous motor measurement. In particular, the disclosure provides a parameter measurement method based on voltage equation and recursive least squares (RLS) method under the $\alpha\beta$ coordinate system of permanent magnet synchronous motor.

DESCRIPTION OF RELATED ART

Online motor parameter measurement plays an important role in real-time motor control and fault diagnosis. Generally, the motor parameters that need to be identified online in permanent magnet synchronous motors include stator resistance $R_s$, d-axis inductance $L_d$, q-axis inductance $L_q$, and flux linkage $\psi_f$. At present, most of the literature on motor parameter measurement focuses on the motor voltage equation under the dq coordinate system. However, the voltage and current under the dq coordinate system are basically constant. Typically, only one parameter may be processed and obtained by using a d-axis or q-axis voltage equation, so only two motor parameters may be processed and obtained simultaneously in the steady state under the dq coordinate system.

Therefore, there is a problem of lack of rank in the parameter measurement of the permanent magnet synchronous motor under the dq coordinate system, and it is impossible to measure all parameters simultaneously. Some studies have shown that the method of signal input may increase the equation to measure all parameters simultaneously, but this approach will affect the normal operation of the motor.

SUMMARY

In order to solve the problems in the related art, the purpose of the present disclosure is to provide a parameter measurement method based on the recursive least squares method under the $\alpha\beta$ coordinate system. Different from the dq coordinate system, two parameters may be obtained simultaneously by a sinusoidal AC phasor equation tinder the $\alpha\beta$ coordinate system (on the condition that the phase difference between the two phasors in the equation is not 0 and 180 degrees). Therefore, four motor parameters may be obtained in the $\alpha\beta$ coordinate system. Compared with the full-parameter measurement under the dq coordinate system, the full-parameter measurement tinder the $\alpha\beta$ coordinate system allows for faster convergence speed and shorter calculation time.

As shown in FIG. 1, the technical solution of the present disclosure is as follows:

(1) Maximum torque per ampere and vector control are performed on the permanent magnet synchronous motor, causing the permanent magnet synchronous motor to run stably and normally.

(2) When the permanent magnet synchronous motor is stably and normally running, the $\alpha$-axis current $i_\alpha$ and the $\beta$-axis current $i_\beta$ are obtained through the three-phase current sampling of the permanent magnet synchronous motor undergoing three-phase to two-phase transformation. The rotor position angle $\theta_e$, and electric rotational speed $\omega_e$ of the permanent magnet synchronous motor are obtained by reading the sensor measurement on the permanent magnet synchronous motor.

(3) According to the $\alpha$-axis current $i_\alpha$, $\beta$-axis current $i_\beta$, $\theta_e$ and $\omega_e$, obtained in step (2) and according to the preset input $\alpha$-axis voltage $v_\alpha$ and $\beta$-axis voltage $v_\beta$, the voltage equation under $\alpha\beta$ coordinate system of permanent magnet synchronous motor is established. The six described physical quantities are taken and a recursive least squares method is used to simultaneously obtain four estimated values $\widehat{R_s}$, $\widehat{L_d}$, $\widehat{L_q}$, and $\widehat{\psi_f}$ for four parameters including a stator resistance, a d-axis inductance, a q-axis inductance, and a flux linkage.

The specific process of the step (3) is as follows: the voltage equation under the $\alpha\beta$ coordinate system is constructed in the following form:

$$v_\alpha - \hat{W}_{\alpha 2} X_{\alpha 2} = \hat{W}_{\alpha 1} X_{\alpha 1}$$

$$v_\beta - \hat{W}_{\alpha 1} X_{\beta 2} = \hat{W}_{\alpha 2} X_{\beta 1}$$

$$\hat{W}_{\alpha 1} = [\widehat{R_s} \ \widehat{L_d}]$$

$$\hat{W}_{\alpha 2} = [\widehat{L_q} \ \widehat{\psi_f}]$$

$$X_{\alpha 1} = [i_\alpha(\tfrac{1}{2}pi_\beta - \omega_e i_\alpha)\sin 2\theta_e + \tfrac{1}{2}pi_\alpha + (\tfrac{1}{2}pi_\alpha + \omega_e i_\beta)\cos 2\theta_e]^T$$

$$X_{\alpha 2} = [\tfrac{1}{2}pi_\alpha - (\tfrac{1}{2}pi_\beta - \omega_e i_\alpha)\sin 2\theta_e - (\tfrac{1}{2}pi_\alpha + \omega_e i_\beta)\cos 2\theta_e - \omega_e \sin \theta_e]^T$$

$$X_{\beta 1} = [\tfrac{1}{2}pi_\beta + (\tfrac{1}{2}pi_\beta - \omega_e i_\alpha)\cos 2\theta_e - (\tfrac{1}{2}pi_\alpha + \omega_e i_\beta)\sin 2\theta_e \ \omega_e \cos \theta_e]^T$$

$$X_{\beta 2} = [i_\beta(\tfrac{1}{2}pi_\alpha + \omega_e i_\beta)\sin 2\theta_e + \tfrac{1}{2}pi_\beta - (\tfrac{1}{2}pi_\beta - \omega_e i_\alpha)\cos 2\theta_e]^T$$

In the equation: $\widehat{R_s}$, $\widehat{L_d}$, $\widehat{L_q}$, and $\widehat{\psi_f}$ are respectively the estimated values of stator resistance, d-axis inductance, q-axis inductance and flux linkage; p represents the differential operator; $X_{\alpha 1}$ represents the first electrical input of the $\alpha$-axis, $X_{\alpha 2}$ represents the second electrical input of the $\alpha$-axis, $X_{\beta 1}$ represents the first electrical input of the $\beta$-axis, $X_{\beta 2}$ represents the second electrical input of the $\beta$-axis; $\hat{W}_{\alpha 1}$ represents the estimated value between the stator resistance and the d-axis inductance, $\hat{W}_{\alpha 2}$ represents the estimated value between the q-axis inductance $L_q$ and the flux linkage $\psi_f$; and T represents the matrix transpose.

Then the recursive least squares method is used to solve the above equations simultaneously to obtain the estimated values of the four parameters, namely stator resistance $R_s$, d-axis inductance $L_d$, q-axis inductance $L_q$ and flux linkage $\psi_f$.

An encoder is disposed on the rotor of the permanent magnet synchronous motor.

In the normal operation state of the permanent magnet synchronous motor, the voltage equation in the $\alpha\beta$ coordinate system of the permanent magnet synchronous motor and the recursive least square method are used for parameter measurement. The implementation steps of the method are as follows:

(1) Maximum torque per ampere (MTPA) and vector control are performed on the permanent magnet synchronous motor, causing the permanent magnet synchronous motor to run stably and normally.

(2) When the permanent magnet synchronous motor is stably and normally running, the $\alpha$-axis current $i_\alpha$ and the $\beta$-axis current $i_\beta$ are obtained through the three-phase current sampling of the permanent magnet synchronous motor undergoing three-phase to two-phase transformation (abc/$\alpha\beta$ transformation). The rotor position angle $\theta_e$ and electric rotational speed $\omega_e$ of the permanent magnet synchronous motor are obtained by reading the sensor measurement on the permanent magnet synchronous motor.

An encoder is disposed on the rotor of the permanent magnet synchronous motor. The encoder is an absolute encoder.

(3) According to the $\alpha$-axis current $i_\alpha$, $\beta$-axis current $i_\beta$, $\theta_e$ and $\omega_e$ obtained in step (2) and according to the preset input $\alpha$-axis voltage $v_\alpha$ and $\beta$-axis voltage $v_\beta$, the voltage equation under $\alpha\beta$ coordinate system of permanent magnet synchronous motor is established. The six described physical quantities are taken and a recursive least squares method is used to simultaneously obtain four parameters respectively, namely stator resistance, d-axis inductance, q-axis inductance, and flux linkage. In this way, simultaneous measurement is achieved.

The $\alpha$-axis voltage $v_\alpha$ and $\beta$-axis voltage $v_\beta$ are given by the space vector pulse width modulation SVPWM input in the permanent magnet synchronous motor control.

The specific process of the full parameter measurement based on the recursive least squares method in the step (3) is as follows: the voltage equation under the $\alpha\beta$ coordinate system is constructed in the following form:

$$v_\alpha - \hat{W}_{\alpha 2} X_{\alpha 2} = \hat{W}_{\alpha 1} X_{\alpha 1}$$

$$v_B - \hat{W}_{\alpha 1} X_{\beta 2} = \hat{W}_{\alpha 2} X_{\beta 1}$$

$$\hat{W}_{\alpha 1} = [\widehat{R_s}\ \widehat{L_d}]$$

$$\hat{W}_{\alpha 2} = [\widehat{L_q}\ \widehat{\psi_f}]$$

$$X_{\alpha 1} = [i_\alpha\ (\tfrac{1}{2}pi_\beta - \omega_e i_\alpha)\sin 2\theta_e + \tfrac{1}{2}pi_\alpha + (\tfrac{1}{2}pi_\alpha + \omega_e i_\beta)\cos 2\theta_e]^T$$

$$X_{\alpha 2} = [\tfrac{1}{2}pi_\alpha - (\tfrac{1}{2}pi_\beta - \omega_e i_\alpha)\sin 2\theta_e - (\tfrac{1}{2}pi_\alpha + \omega_e i_\beta)\cos 2\theta_e - \omega_e \sin \theta_e]^T$$

$$X_{\beta 1} = [\tfrac{1}{2}pi_\beta + (\tfrac{1}{2}pi_\beta - \omega_e i_\alpha)\cos 2\theta_e - (\tfrac{1}{2}pi_\alpha + \omega_e i_\beta)\sin 2\theta_e \omega_e \cos \theta_e]^T$$

$$X_{\beta 2} = [i_\beta (\tfrac{1}{2}pi_\alpha + \omega_e i_\beta)\sin 2\theta_e + \tfrac{1}{2}pi_\beta - (\tfrac{1}{2}pi_\beta - \omega_e i_\alpha)\cos 2\theta_e]^T$$

In the equation: $\widehat{R_s}$, $\widehat{L_d}$, $\widehat{L_q}$ and $\widehat{\psi_f}$ are respectively the estimated values of stator resistance, d-axis inductance, q-axis inductance and flux linkage; p represents the differential operator; $X_{\alpha 1}$ represents the first electrical input of the $\alpha$-axis, $X_{\alpha 2}$ represents the second electrical input of the $\alpha$-axis, $X_{\beta 1}$ represents the first electrical input of the $\beta$-axis, $X_{\beta 2}$ represents the second electrical input of the $\beta$-axis; $\hat{W}_{\alpha 1}$ represents the estimated value between the stator resistance and the d-axis inductance, $\hat{W}_{\alpha 2}$ represents the estimated value between the q-axis inductance $L_q$ and the flux linkage $\psi_f$; and T represents the matrix transpose.

Then the recursive least squares method is used to solve the above equations simultaneously to obtain the estimated values of the four parameters, namely stator resistance $R_s$, d-axis inductance $L_d$, q-axis inductance $L_q$ and flux linkage $\psi_f$.

The measurement method of the present disclosure is different from the dq coordinate system. Under the $\alpha\beta$ coordinate system, the voltage and current quantities are all sinusoidal AC phasors. When using linear regression strategies such as the recursive least square method for parameter measurement, two parameters may be obtained simultaneously by a sinusoidal AC phasor equation (provided that the phase difference between the two phasors in the equation is not 0 and 180 degrees). Therefore, four motor parameters may be obtained in the alp coordinate system. Compared with the full-parameter measurement under the dq coordinate system, the full-parameter measurement under the $\alpha\beta$ coordinate system allows for faster convergence speed and shorter calculation time.

Advantageous effects of the present disclosure are as follows:

The disclosure combines the voltage equation set under the $\alpha\beta$ coordinate system and the recursive least square method, and is able to directly perform full-parameter measurement on the permanent magnet synchronous motor. Compared with the full-parameter measurement under the dq coordinate system, the full-parameter measurement under the alp coordinate system of the present disclosure allows for faster convergence speed and shorter calculation time, and achieves higher instantaneity.

DESCRIPTION OF THE EMBODIMENTS

Figure 1:
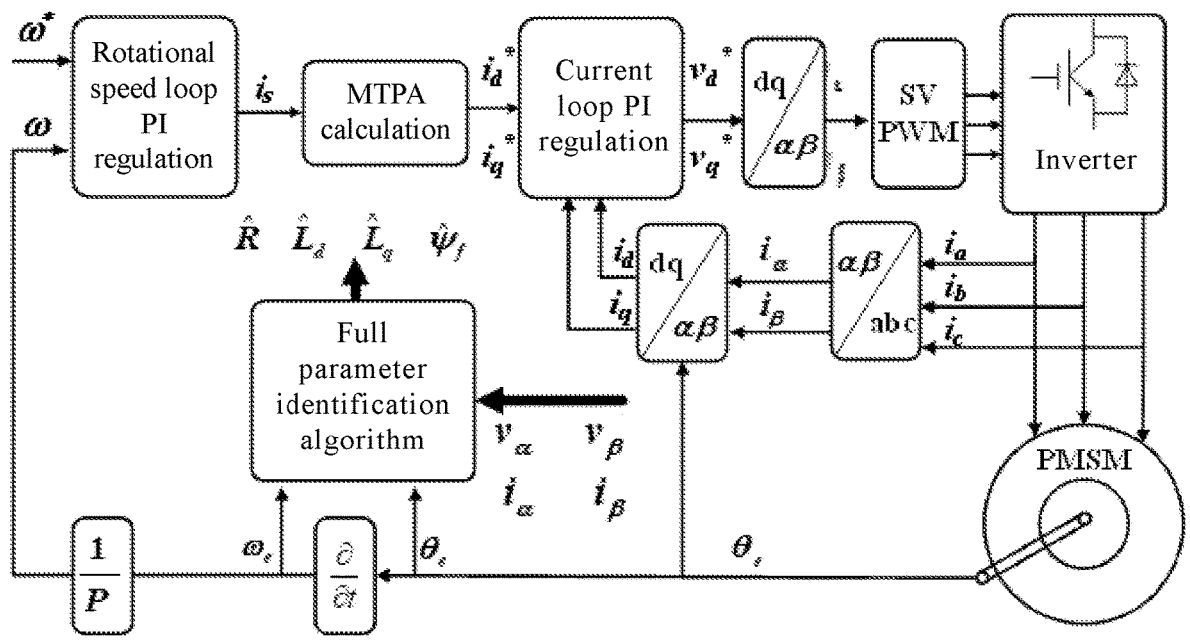
FIG. 1 is an overall control block diagram of realizing a motor of the present disclosure.

The present disclosure will be further elaborated below in conjunction with the accompanying drawings and embodiments.

According to the content of the present disclosure, the practical embodiment and the implementation of the complete embodiment is as follows.

In order to verify the reliability of this method, related experiments were carried out. The parameters of the interior permanent magnet motor (IPMSM) used as an example in the experiment are shown in Table I below.

TABLE 1

| Motor Parameters | |
| --- | --- |
| Motor type | IPMSM |
| Stator resistance | 0.065 Ω |
| Flux linkage | 0.02 Vs |

TABLE 1-continued

Motor Parameters

| | |
|---|---|
| d-axis inductance | 37.3 μH |
| q-axis inductance | 48.8 μH |
| DC bus voltage | 60 V |
| Rated torque | 5 Nm |
| Rated speed | 1500 rpm |

The process flow is as follows.
(1) Maximum torque per ampere (MTPA) and vector control are performed on the permanent magnet synchronous motor, causing the permanent magnet synchronous motor to run stably and normally.
(2) An absolute encoder is provided on the rotor of the permanent magnet synchronous motor. When the permanent magnet synchronous motor is stably and normally running, the α-axis current $i_\alpha$ and the β-axis current $i_\beta$ are obtained through the three-phase current sampling of the permanent magnet synchronous motor undergoing three-phase to two-phase transformation (abc/αβ transformation). The rotor position angle $\theta_e$ and electric rotational speed $\omega_e$ of the permanent magnet synchronous motor are obtained by reading the sensor measurement on the permanent magnet synchronous motor.
(3) According to the α-axis current $i_\alpha$, β-axis current $i_\beta$, $\theta_e$ and $\omega_e$ obtained in step (2) and according to the preset input α-axis voltage $v_\alpha$ and β-axis voltage $v_\beta$, the voltage equation under αβ coordinate system of permanent magnet synchronous motor is established. The six described physical quantities are taken and a recursive least squares method is used to simultaneously obtain four parameters respectively for stator resistance $R_s$, d-axis inductance $L_d$, q-axis inductance $L_q$, and flux linkage $\psi_f$. The voltage equation under the αβ coordinate system is constructed in the following form.

$$v_\alpha - \hat{W}_{\alpha 2} X_{\alpha 2} = \hat{W}_{\alpha 1} X_{\alpha 1}$$

$$v_\beta - \hat{W}_{\alpha 1} X_{\beta 2} = \hat{W}_{\alpha 2} X_{\beta 1}$$

$$\hat{W}_{\alpha 1} = [\widehat{R_s}\ \widehat{L_d}]$$

$$\hat{W}_{\alpha 2} = [\widehat{L_q}\ \widehat{\psi_f}]$$

$$X_{\alpha 1} = [i_\alpha (\tfrac{1}{2} p i_\beta - \omega_e i_\alpha) \sin 2\theta_e + \tfrac{1}{2} p i_\alpha + (\tfrac{1}{2} p i_\alpha + \omega_e i_\beta) \cos 2\theta_e] T$$

$$X_{\alpha 2} = [\tfrac{1}{2} p i_\alpha - (\tfrac{1}{2} p i_\beta - \omega_e i_\alpha) \sin 2\theta_e - (\tfrac{1}{2} p i_\alpha + \omega_e i_\beta) \cos 2\theta_e - \omega_e \sin \theta_e] T$$

$$X_{\beta 1} = [\tfrac{1}{2} p i_\beta + (\tfrac{1}{2} p i_\beta - \omega_e i_\alpha) \cos 2\theta_e - (\tfrac{1}{2} p i_\alpha + \omega_e i_\beta) \sin 2\theta_e \omega_e \cos \theta_e] T$$

$$X_{\beta 2} = [i_\beta (\tfrac{1}{2} p i_\alpha + \omega_e i_\beta) \sin 2\theta_e + \tfrac{1}{2} p i_\beta - (\tfrac{1}{2} p i_\beta - \omega_e i_\alpha) \cos 2\theta_e] T$$

In the equation: $\widehat{R_s}$, $\widehat{L_d}$, $\widehat{L_q}$, and $\widehat{\psi_f}$ are respectively the estimated values of stator resistance, d-axis inductance, q-axis inductance and flux linkage; p represents the differential operator: $X_{\alpha 1}$ represents the first electrical input of the α-axis, $X_{\alpha 2}$ represents the second electrical input of the α-axis, $X_{\beta 1}$ represents the first electrical input of the β-axis, $X_{\beta 2}$ represents the second electrical input of the β-axis; $\hat{W}_{\alpha 1}$ represents the estimated value between the stator resistance and the d-axis inductance, $\hat{W}_{\alpha 2}$ represents the estimated value between the q-axis inductance $L_q$ and the flux linkage $\psi_f$; and T represents the matrix transpose.

Then the recursive least squares method is used to solve the above equations simultaneously to obtain the four parameters, namely stator resistance $R_s$, d-axis inductance $L_d$, q-axis inductance $L_q$ and flux linkage $\psi_f$.

Figure 2:
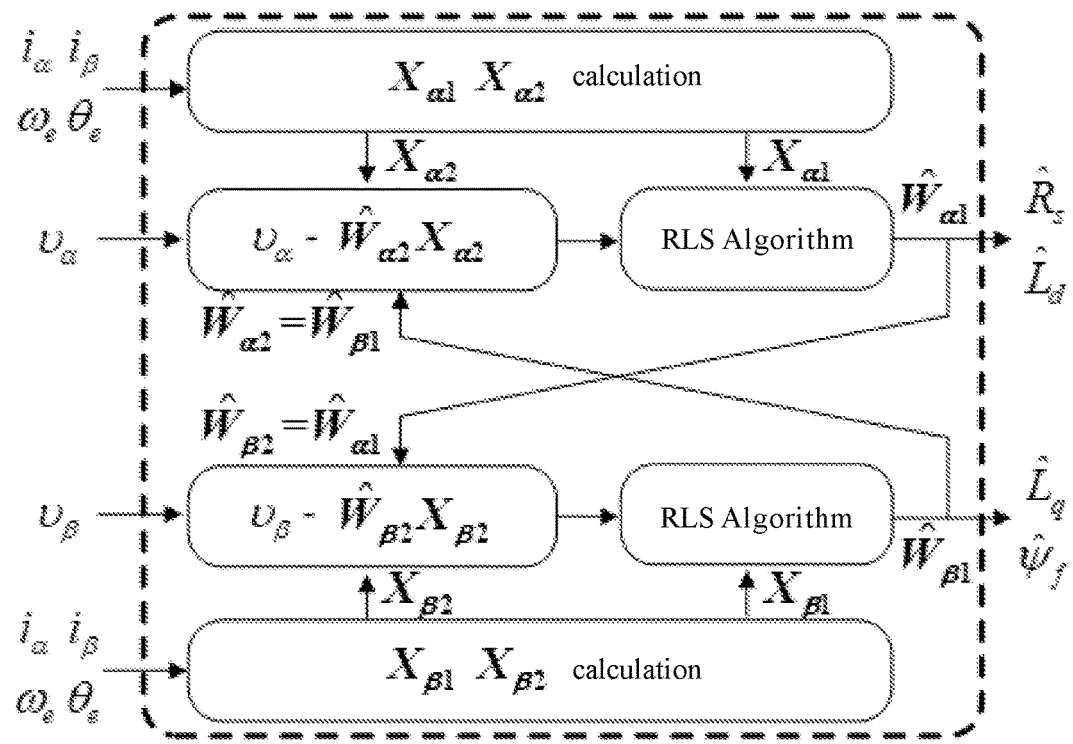
FIG. 2 is a block diagram realizing the recursive least square method algorithm of the present disclosure.

The specific block diagram of the full-parameter measurement method is shown in FIG. 2, and the solution process is as follows.

First, $i_\alpha$, $i_\beta$, $\theta_e$, and $\omega_e$ obtained by measurement and calculation were used to calculate $X_{\alpha 1}$, $X_{\alpha 2}$, $X_{\beta 1}$, and $X_{\beta 2}$. According to $v_\alpha$ and $X_{\alpha 2}$ as well as $\hat{W}_{\alpha 2} = \hat{W}_{\beta 1}$, $v_\alpha - \hat{W}_{\alpha 2} X_{\alpha 2}$ was calculated, and $v_\alpha - \hat{W}_{\alpha 2} X_{\alpha 2}$ and $X_{\alpha 1}$ were used as the input of the recursive least squares method to obtain $\widehat{R_s}$ and $\widehat{L_d}$; according to $v_\beta$ and $X_{\beta 2}$ as well as $\hat{W}_{\beta 2} = \hat{W}_{\alpha 1}$, $v_\beta - \hat{W}_{\beta 2} X_{\beta 2}$ were calculated. $v_\beta - \hat{W}_{\beta 2} X_{\beta 2}$ and $X_{\beta 1}$ were taken as the input of the recursive least squares method to obtain $\widehat{L_q}$ and $\widehat{\psi_f}$.

Then the α-axis voltage equation is used to process the stator resistance $\widehat{R_s}$ and d-axis inductance $\widehat{L_d}$ and the β-axis voltage equation is used to process the q-axis inductance $\widehat{L_q}$ and flux linkage $\widehat{\psi_f}$. $\hat{W}_{\alpha 1} = [\widehat{R_s}\ \widehat{L_d}]$ obtained by processing the α-axis voltage equation is used to calculate $\hat{W}_{\beta 2}$ on the left side of the β-axis voltage equation. $\omega_{\beta 1} = [\widehat{L_q}\ \widehat{\psi_f}]$ obtained by processing the β-axis voltage equation is used to calculate $\hat{W}_{\alpha 2}$ on the left side of the α-axis voltage equation.

In this way, all parameters may be processed and obtained simultaneously.

Figure 3:
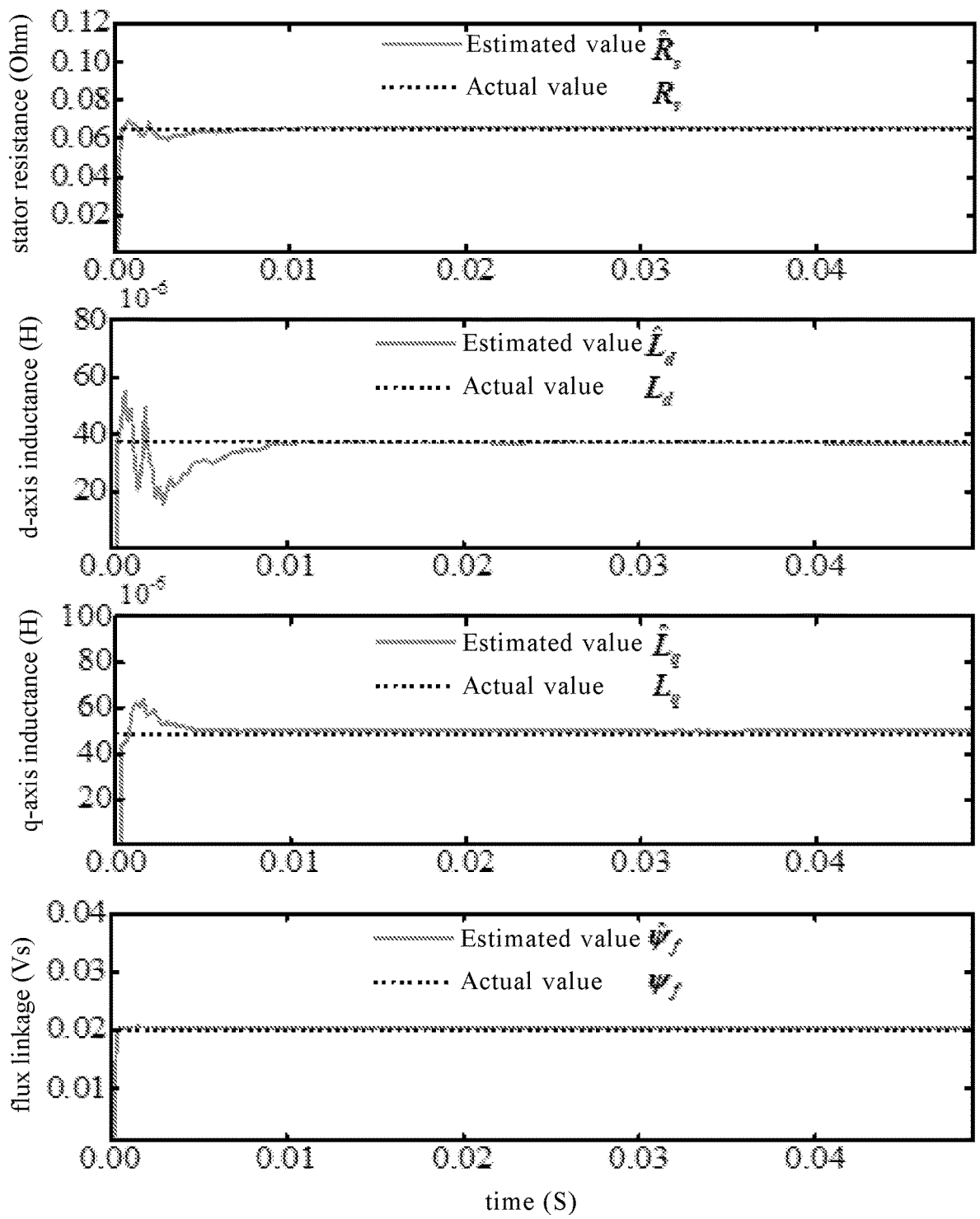
FIG. 3 is a simulation verification diagram for realizing the algorithm of the present disclosure.

FIG. 3 is the simulation result of the full-parameter measurement by the method of the present disclosure when the motor speed is 1500 rpm and the torque is 5 Nm. Based on the results, it can be seen that the method of the present disclosure is able to quickly obtain four motor parameters, and the error is very small while the convergence time is very short.

What is claimed is:
1. A driving method for real-time control a permanent magnet synchronous motor, comprising:
(1) performing a maximum torque per ampere and a vector control on the permanent magnet synchronous motor, causing the permanent magnet synchronous motor to run stably and normally, wherein the permanent magnet synchronous motor is coupled to an inverter;
(2) when the permanent magnet synchronous motor is stably and normally running, obtaining an α-axis current $i_\alpha$ and a β-axis current $i_\beta$ through three-phase current sampling of the permanent magnet synchronous motor undergoing a three-phase to two-phase transformation, and obtaining a rotor position angle $\theta_e$ and an electric rotational speed $\omega_e$ of the permanent magnet synchronous motor by reading a sensor measurement on the permanent magnet synchronous motor;
(3) establishing a voltage equation under a αβ coordinate system of the permanent magnet synchronous motor according to the α-axis current $i_\alpha$, the β-axis current $i_\beta$, the $\theta_e$ and the $\omega_e$ obtained in the step (2) and according to a preset input a-axis voltage vg and a preset input β-axis voltage $v_\beta$, wherein six physical quantities mentioned above are taken and a recursive least squares method is used to simultaneously obtain four estimated values $\widehat{R_s}$, $\widehat{L_d}$, $\widehat{L_q}$, $\widehat{\psi_f}$ for four parameters, wherein the four parameters are a stator resistance $R_s$, a d-axis inductance $L_d$, a q-axis inductance $L_q$, and a flux linkage $\psi_f$, wherein a process of step (3) is as follows: constructing the voltage equation under the αβ coordinate system in the following form:

$v_\alpha - \hat{W}_{\alpha 2} X_{\alpha 2} = \hat{W}_{\alpha 1} X_{\alpha 1}$ $v_\beta - \hat{W}_{\alpha 1} X_{\beta 2} = \hat{W}_{\alpha 2} X_{\beta 1}$ $\hat{W}_{\alpha 1} = [\widehat{R_s} \; \widehat{L_d}]$ $\hat{W}_{\alpha 2} = [\widehat{L_q} \; \widehat{\psi_f}]$ $X_{\alpha 1} = [i_\alpha (\frac{1}{2} p i_\beta - \omega_e i_\alpha) \sin 2\theta_e + \frac{1}{2} p i_\alpha + (\frac{1}{2} p i_\alpha + \omega_e i_\beta) \cos 2\theta_e]^T$ $X_{\alpha 2} = [\frac{1}{2} p i_\alpha - (\frac{1}{2} p i_\beta - \omega_e i_\alpha) \sin 2\theta_e - (\frac{1}{2} p i_\alpha + \omega_e i_\beta) \cos 2\theta_e - \omega_e \sin \theta_e]^T$ $X_{\beta 1} = [\frac{1}{2} p i_\beta + (\frac{1}{2} p i_\alpha - \omega_e i_\alpha) \cos 2\theta_e - (\frac{1}{2} p i_\alpha + \omega_e i_\beta) \sin 2\theta_e \omega_e \cos \theta_e]^T$ $X_{\beta 2} = [i_\beta (\frac{1}{2} p i_\alpha + \omega_e i_\beta) \sin 2\theta_e + \frac{1}{2} p i_\beta - (\frac{1}{2} p i_\beta - \omega_e i_\alpha) \cos 2\theta_e]^T$ wherein $\widehat{R_s}$, $\widehat{L_d}$, $\widehat{L_q}$, and $\widehat{\psi_f}$ are the estimated values of the stator resistance $R_s$, the d-axis inductance $L_d$ the q-axis inductance $L_q$, and the flux linkage $\psi_f$, respectively; p represents a differential operator; $X_{\alpha 1}$ represents a first electrical input of an α-axis, $X_{\alpha 2}$ represents a second electrical input of the α-axis, $X_{\beta 1}$ represents a first electrical input of a β-axis, $X_{\beta 2}$ represents a second electrical input of the β-axis; $\hat{W}_{\alpha 1}$ represents an estimated value between the stator resistance and the d-axis inductance, $\hat{W}_{\alpha 2}$ represents an estimated value between the q-axis inductance $L_q$ and the flux linkage $\psi_f$; and T represents a matrix transpose;

using the recursive least squares method to simultaneously solve above-mentioned equations to obtain the four estimated values $\widehat{R_s}$, $\widehat{L_d}$, $\widehat{L_q}$, $\widehat{\psi_f}$ for the four parameters; and (4) using the four estimated values $\widehat{R_s}$, $\widehat{L_d}$, $\widehat{L_q}$, $\widehat{\psi_f}$ as control parameters to control the inverter to generate a driving current, and using the driving current to drive the permanent magnet synchronous motor.

2. The driving method for real-time control the permanent magnet synchronous motor according to claim 1, wherein an encoder is disposed on a rotor of the permanent magnet synchronous motor.

* * * * *